United States Patent
Pang

(10) Patent No.: US 7,607,815 B2
(45) Date of Patent: Oct. 27, 2009

(54) LOW PROFILE AND HIGH EFFICIENCY LIGHTING DEVICE FOR BACKLIGHTING APPLICATIONS

(75) Inventor: Siew It Pang, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/605,984

(22) Filed: Nov. 27, 2006

(65) Prior Publication Data

US 2008/0284308 A1 Nov. 20, 2008

(51) Int. Cl.
*F21V 8/00* (2006.01)
(52) U.S. Cl. .......................... 362/612; 362/561
(58) Field of Classification Search .............. 362/612, 362/613, 615, 561, 511, 330; 349/67, 69, 349/61
See application file for complete search history.

(56) References Cited

U.S. PATENT DOCUMENTS

| | | | | |
|---|---|---|---|---|
| 5,440,460 A | * | 8/1995 | Melberg | 362/101 |
| 6,441,943 B1 | * | 8/2002 | Roberts et al. | 359/267 |
| 6,513,949 B1 | * | 2/2003 | Marshall et al. | 362/231 |
| 2003/0156430 A1 | * | 8/2003 | Ota et al. | 362/574 |
| 2004/0141305 A1 | * | 7/2004 | Higashiyama | 362/31 |

* cited by examiner

*Primary Examiner*—Sharon E Payne

(57) ABSTRACT

A light source having a flexible substrate and a plurality of dies having LEDs is disclosed. The light source can be conveniently utilized to provide an extended light source by bonding the light source to a suitable light pipe. The substrate is divided into first and second regions. The dies are bonded to the substrate in a first region. A portion of the surface of the substrate in the second region is reflective. The substrate is bent such that the second region forms a reflector that reflects light that would otherwise be emitted in a non-useful direction to a more useful direction. The substrate can be constructed from a three layer flexible circuit carrier in which the dies are mounted on a bottom metal layer to provide an improved thermal path for heat generated in the dies.

17 Claims, 7 Drawing Sheets

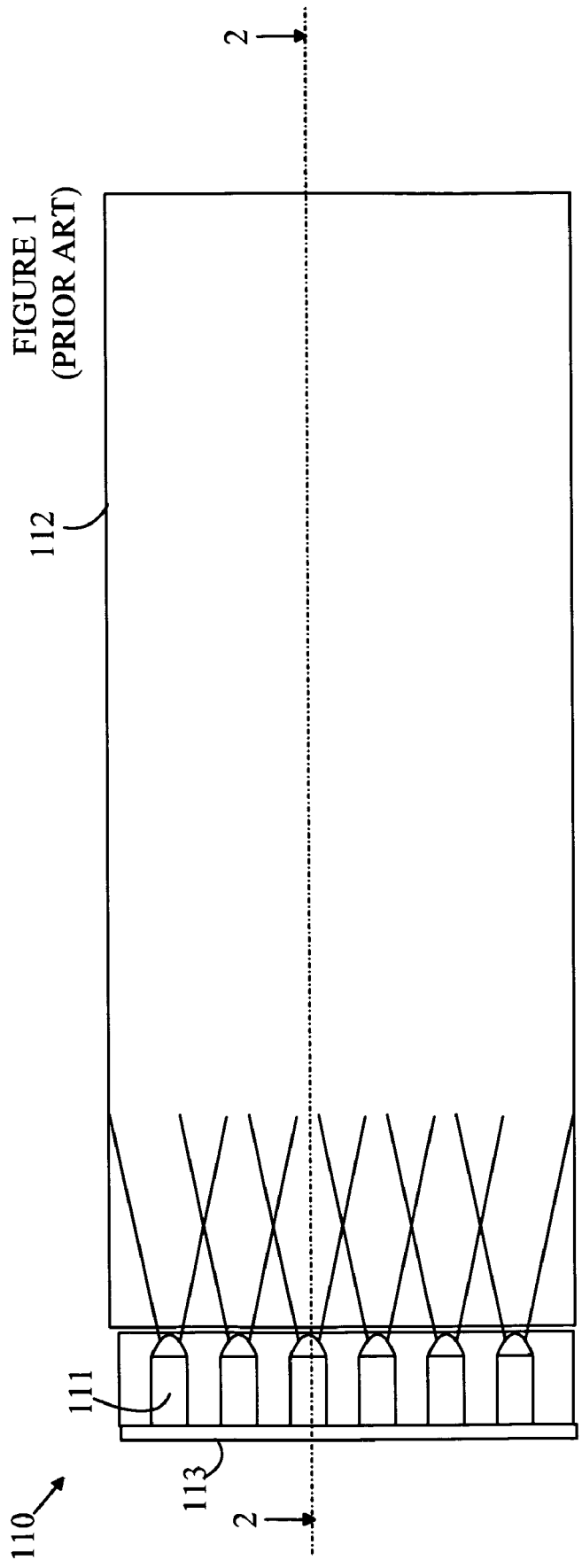
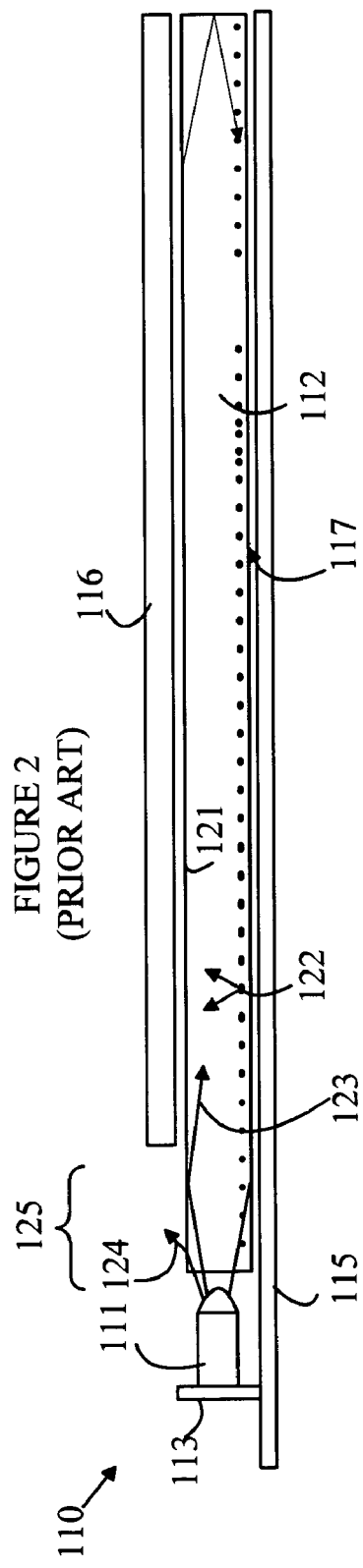

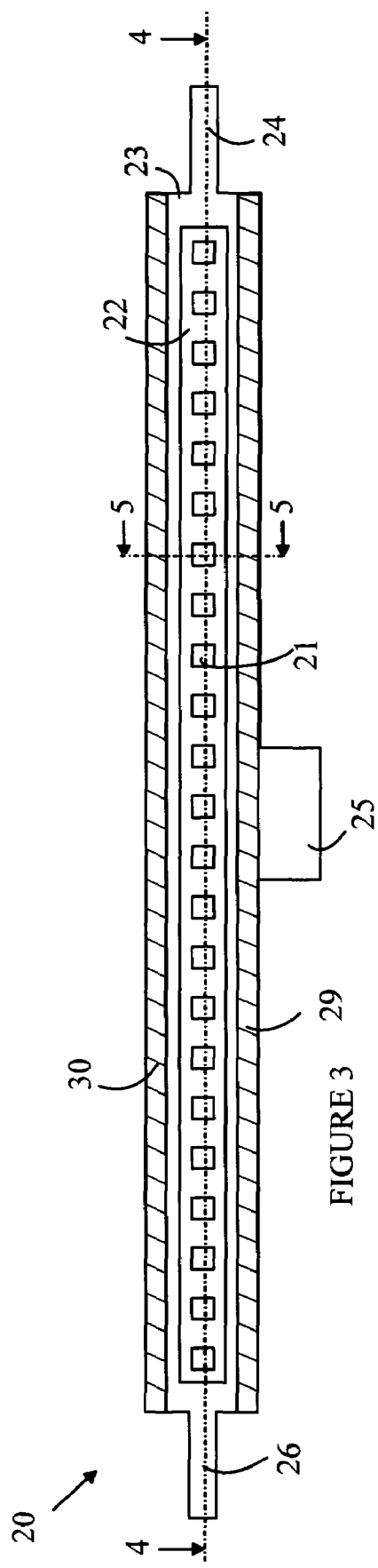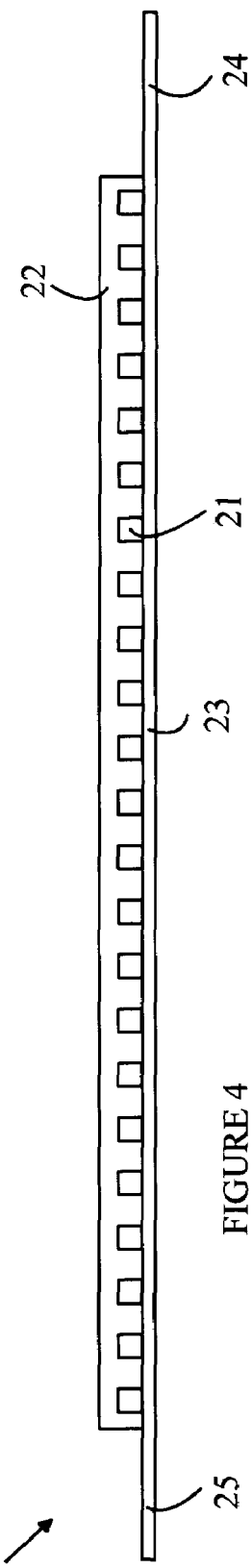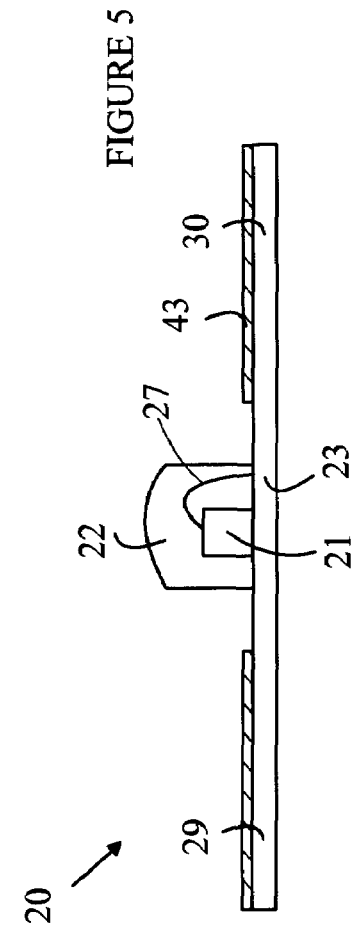
FIGURE 3
FIGURE 4
FIGURE 5

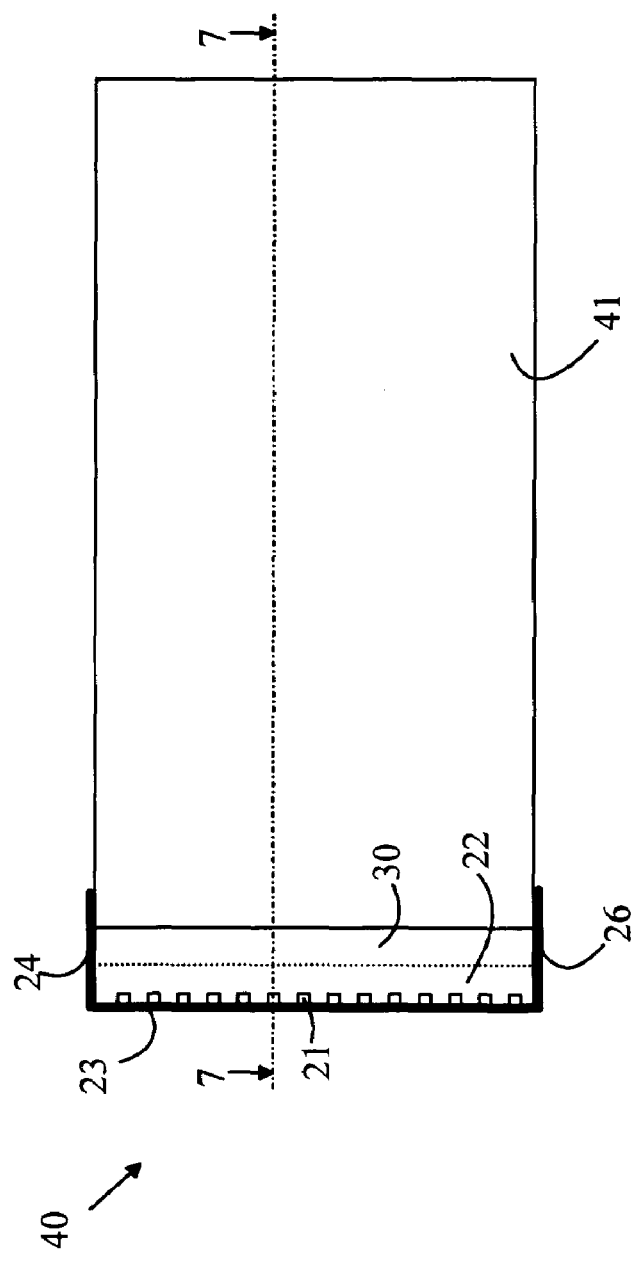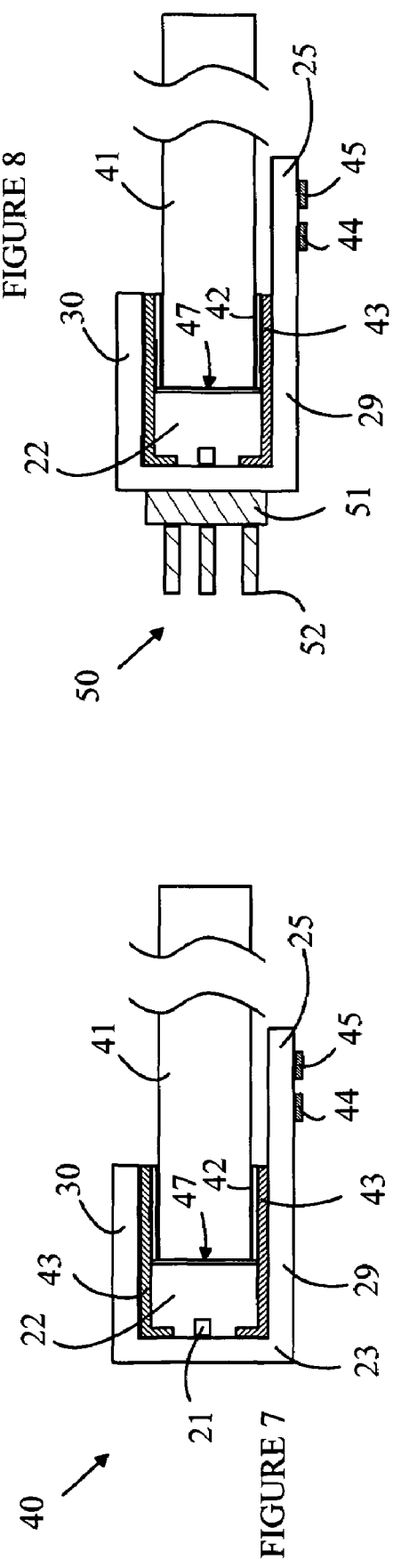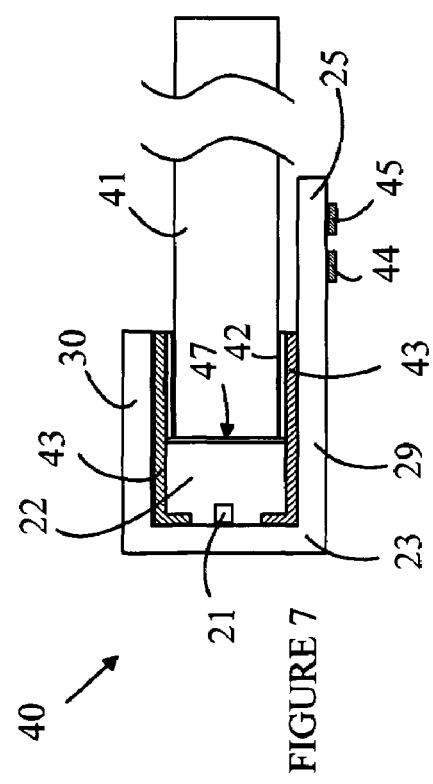

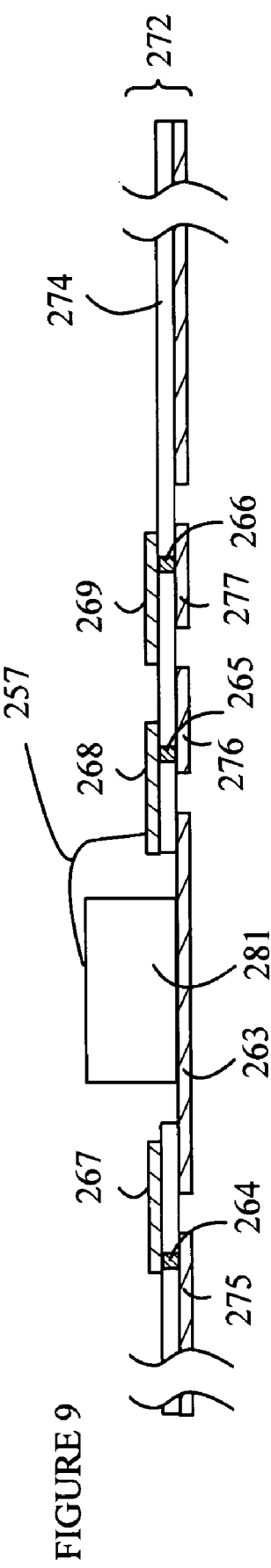
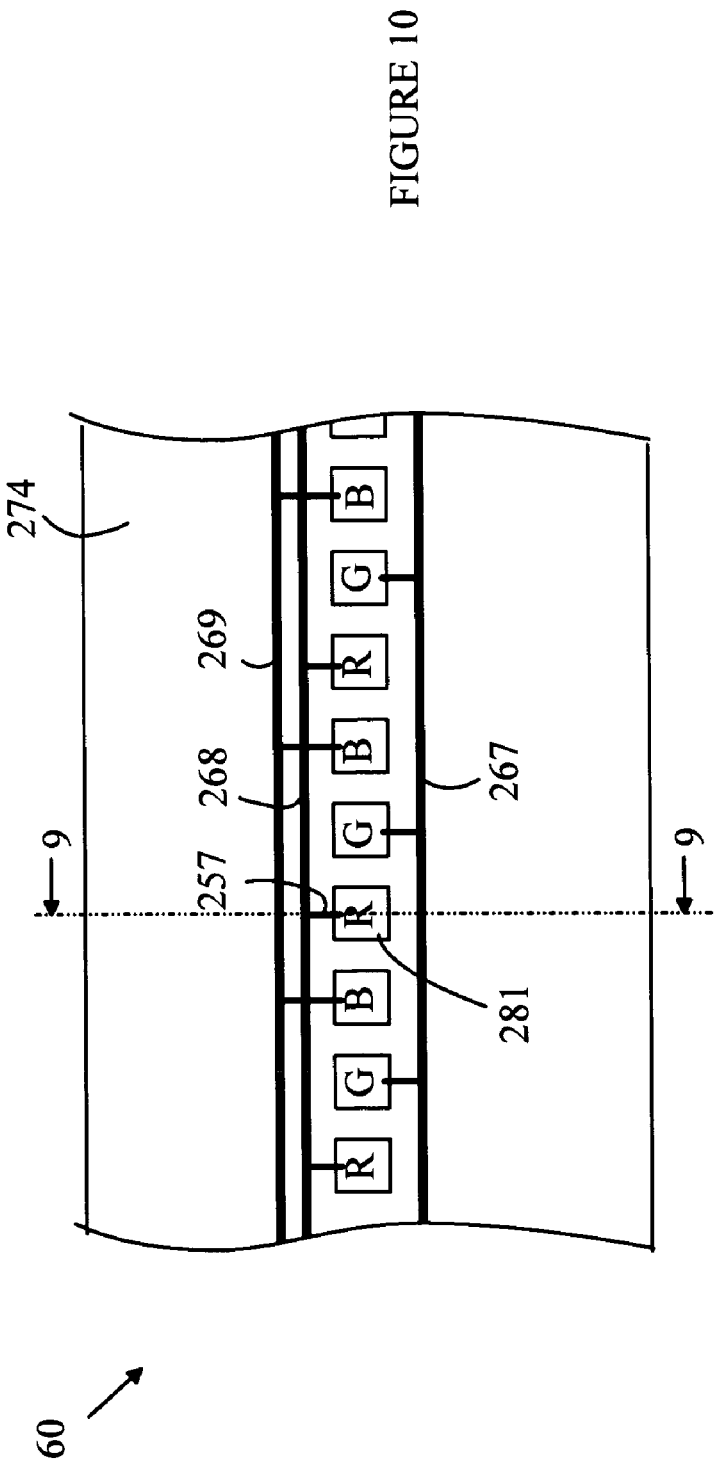
FIGURE 9
FIGURE 10

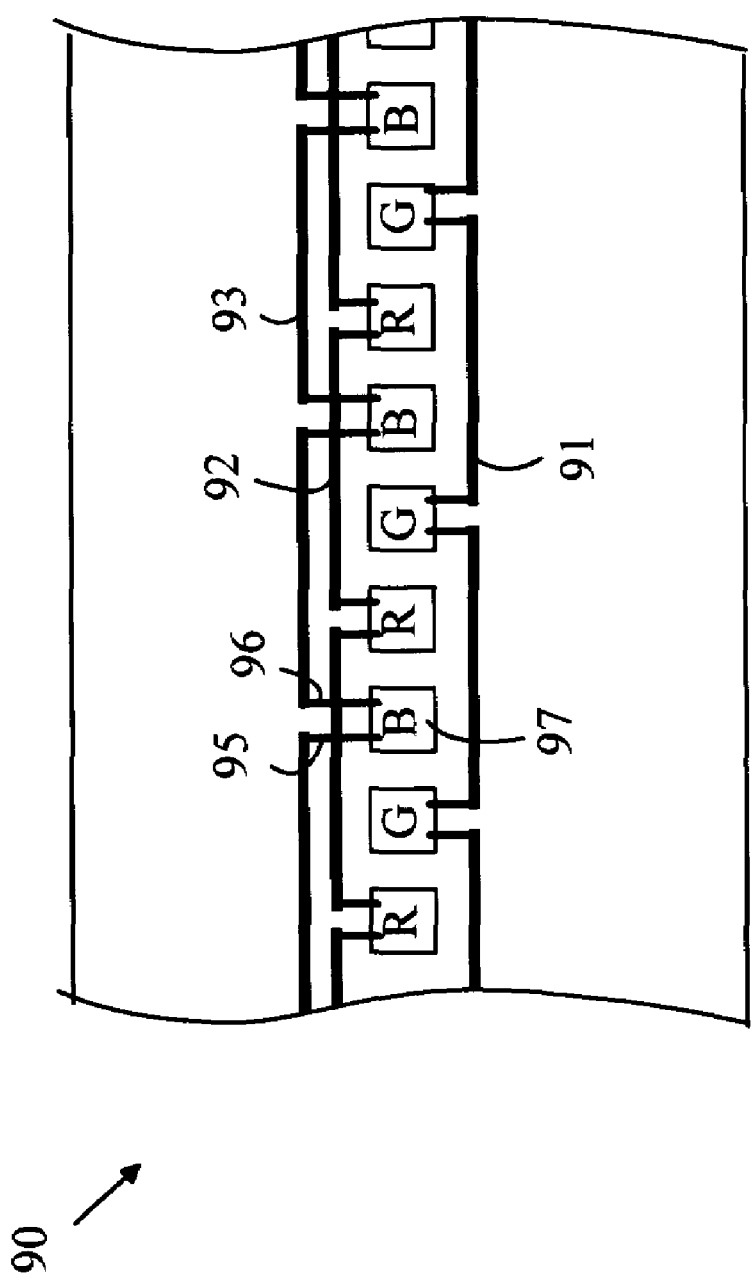

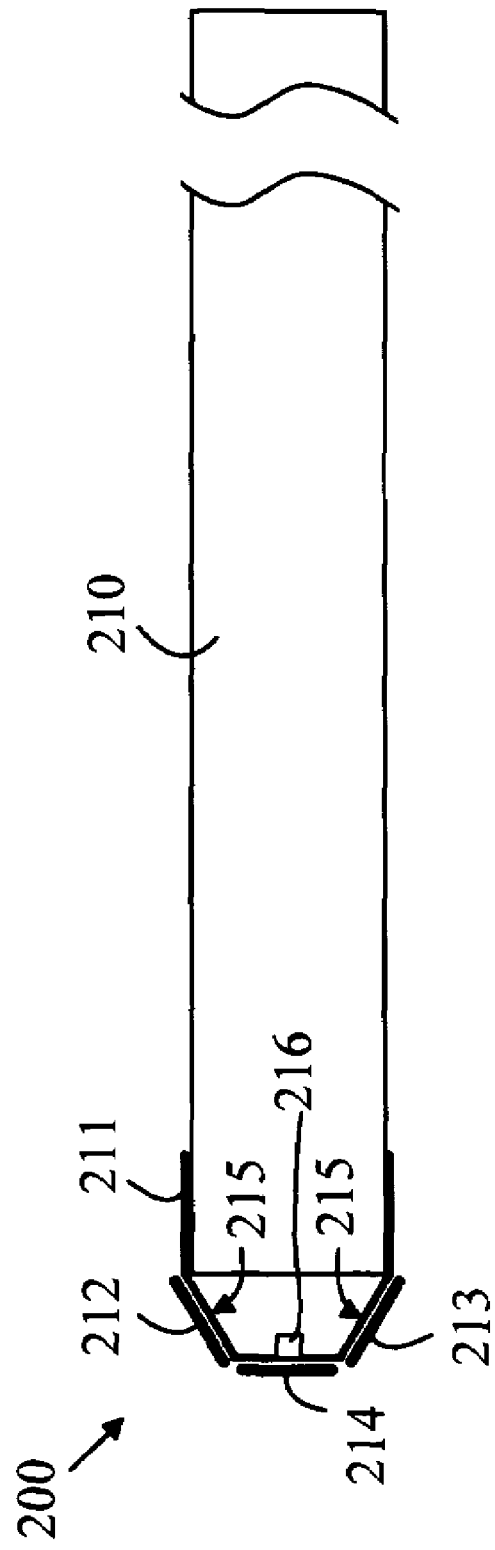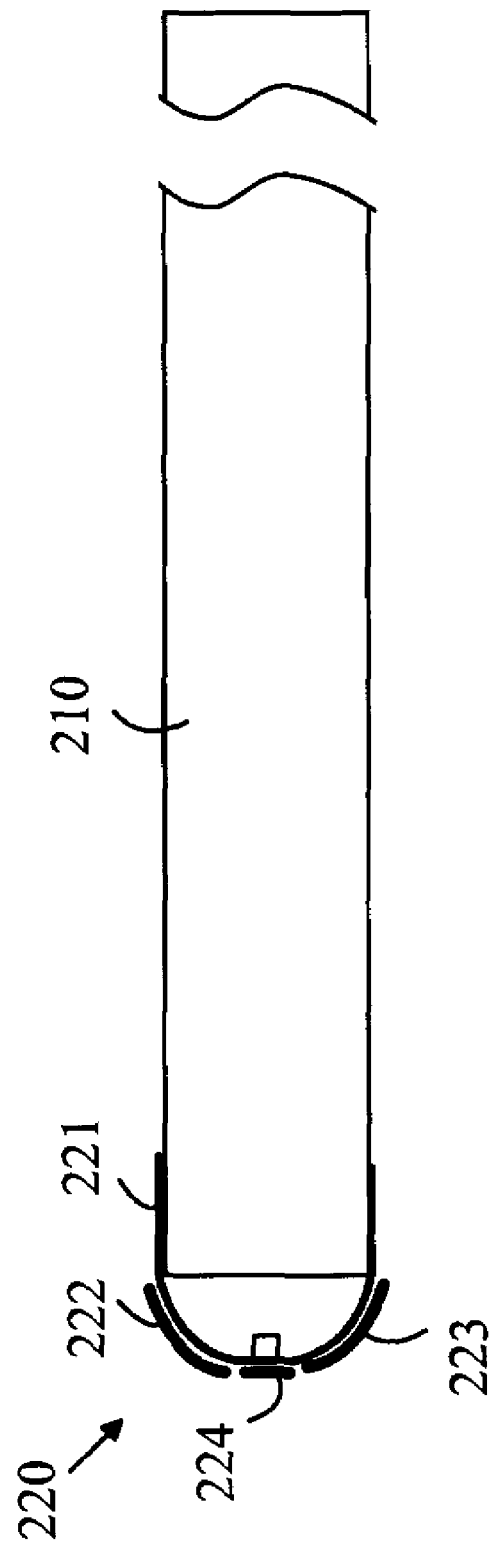

LOW PROFILE AND HIGH EFFICIENCY LIGHTING DEVICE FOR BACKLIGHTING APPLICATIONS

BACKGROUND OF THE INVENTION

Liquid crystal displays (LCDs) are used in a wide variety of computers and consumer devices such as TVs. A back-lighted LCD is an array of pixels in which each pixel acts as a shutter that either passes or blocks light from a light source that is located behind the pixel. Color displays are implemented by equipping the pixels with color filters such that each pixel transmits or blocks light of a particular color. The intensity of the light from each pixel is set by the time the pixel is in the transmissive state.

The display is typically illuminated by a white light source that provides a uniform intensity of light across the back surface of the display. Illumination sources based on fluorescent lights are particularly attractive because of their high light output per watt-hour of power consumed. However, such sources require high driving voltages which makes them less attractive for battery operated devices.

As a result, there has been considerable interest in utilizing light sources based on LEDs in such applications. LEDs have similar electrical efficiency and long lifetimes. In addition, the driving voltages needed are compatible with the battery power available on most portable devices. An LED light source for generating an arbitrary color of light is typically constructed from three LEDs. The relative intensities of the LEDs are adjusted by adjusting the drive current through the LED and/or the duty factor of the LED. In the latter arrangement, the LEDs are turned on and off within a cycle time that is too short to be perceived by a human observer. The intensity of the light seen by the viewer is the average intensity, and hence, the relative intensities of the various colors are determined by the percentage of the time the various LEDs are turned on.

Back lighted illumination systems for LCD arrays typically utilize some form of light box or light pipe behind the LCD array. The light pipe is a rectilinear transparent solid constructed from a transparent plastic having one surface that has dimensions that are larger than the LCD array. The goal of the illumination system is to have this surface act as an extended light source having a uniform light intensity over the surface. Light is injected into the light pipe at the periphery of the light pipe. The light is trapped in the light pipe by internal reflections until the light is scattered in a manner that allows it to escape through the top surface, which is the surface that is adjacent to the LCD array. The bottom surface of the light box or the material of the light pipe itself has scattering centers that redirect the light hitting each center so that a portion of the light exits through the top surface.

In many applications, the size of the light source is an important factor. For small handheld devices, size is particularly important both in terms of the thickness of the light source and the amount of space required around the edges of the extended light source that is needed for the light source that illuminates the light box.

The thickness of the light source, and hence, the device is limited by the thickness of the light box. The thickness of the display is particularly important in displays used for laptop computers and handheld devices such as PDAs and cellular telephones, as the display thickness limits the overall thickness of the device. Some of these portable devices require light boxes that are less than 1 mm in thickness.

Light sources that are constructed from a light box that is illuminated along one or more edges by discrete packaged LEDs are limited both in terms of the thickness of the light source and the amount of edge space that is needed in addition to the surface that is being illuminated. As the thickness of the display decreases, the efficient injection of light into the light pipe becomes more problematic. Light must enter the edge of the light pipe at a predetermined point within a predetermined cone of angles. Typically, the light source consists of a number of packaged LEDs that are mounted on a small substrate such that the light emission direction of the LEDs is parallel to the surface of the light pipe. This substrate is attached to a circuit board that is under the light pipe such that light is emitted into the edge of the light pipe. If the relative positions of the light source and light pipe are not correct, part of the light can be lost either because the light misses the edge of the light pipe or because the angle at which some of the light enters the light pipe is greater than the critical angle, and hence, that light leaves the light pipe at the first reflection. In either case, the efficiency and/or the uniformity of the illumination system is reduced. In addition, when the thickness of the light pipe becomes less than the diameter of the LED package, providing good coupling of the light into the light pipe becomes even more difficult.

In addition, there is a minimum distance between the LEDs that is set by the diameter of the LED package. In a color light source, the LEDs are normally arranged as repeating red, green, and blue LEDs along the axis of the light source. The light entering the light source has hot spots immediately adjacent to the packaged LEDs both in terms of intensity and color. Hence, the region adjacent to the edge is reserved as a mixing region, and hence, the surface above this region is not useable as part of the extended light source.

SUMMARY OF THE INVENTION

The present invention includes a light source having a flexible substrate and a plurality of dies having LEDs. In one aspect of the invention, the flexible substrate has a dielectric layer sandwiched between top and bottom metal layers, and the flexible substrate is divided into first and second regions. The dies are bonded to the bottom layer in the first region. The first region is characterized by a normal to the bottom layer in the first region, at least one of the top and bottom metal layers includes a plurality of electrical traces for connecting the dies to circuitry that is external to the light source. The top metal layer of the substrate is reflective in the second region. The substrate is bent such that the first region is at an angle with respect to the second region and a portion of the light, emitted from the dies at an initial angle greater than zero to the normal, striking the second region and is reflected therefrom into a direction having an angle with respect to the normal that is less than the initial angle. In another aspect of the invention, the substrate includes a connector region outside of the first region and having a plurality of electrical contacts connected to the traces, the connector region is configured to mate to a connector that is external to the light source. In another aspect of the invention, a rigid member is bonded to the bottom metal layer. In another aspect of the invention, a light pipe is utilized to form an extended light source. The second region is bonded to a surface of the light pipe such that the dies are positioned to inject light into an edge of the light pipe.

BRIEF DESCRIPTION OF THE DRAWINGS

FIG. 1 is a top view of a prior art light source 110.

FIG. 2 is a cross-sectional view of light source 110 through line 2-2 shown in FIG. 1.

FIG. 3 is a top view of a light source according to one embodiment of the present invention.

FIG. 4 is a cross-sectional view through line 4-4 shown in FIG. 3.

FIG. 5 is a cross-sectional view through line 5-5 shown in FIG. 3.

FIG. 6 is a top view of an extended light source according to one embodiment of the present invention.

FIG. 7 is a cross-sectional view through line 7-7 shown in FIG. 6.

FIG. 8 is a cross-sectional view of another embodiment of an extended light source according to the present invention.

FIG. 9 is a cross-sectional view through line 9-9 shown in FIG. 10.

FIG. 10 is a top view of a light source according to one embodiment of the present invention.

FIG. 11 is a top view of another embodiment of a light source according to the present invention.

FIG. 12 is a cross-sectional view of another embodiment of an extended light source according to one embodiment of the present invention.

FIG. 13 is a cross-sectional view of another embodiment of an extended light source according to the present invention.

DETAILED DESCRIPTION OF THE PREFERRED EMBODIMENTS OF THE INVENTION

Figure 14:
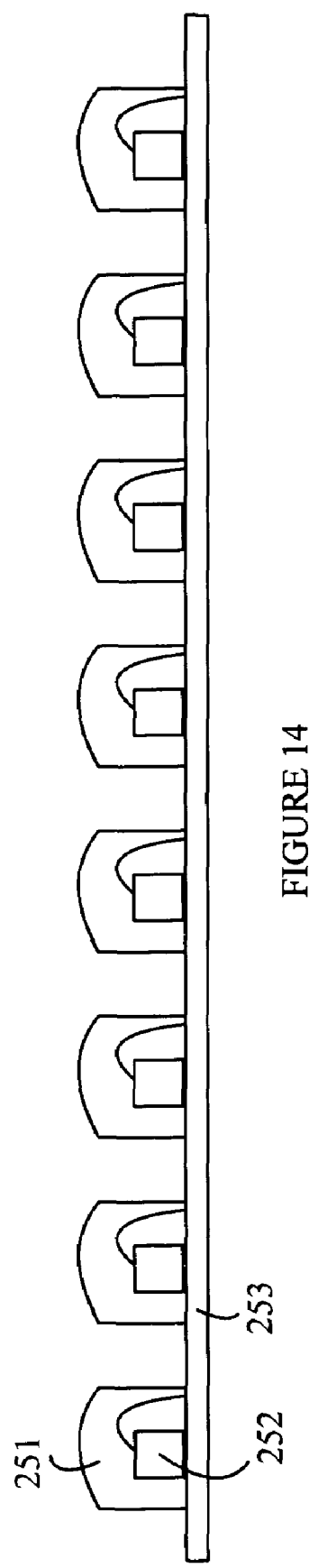
FIG. 14 is a cross-sectional view of a linear array of dies on a substrate in which the individual dies are individually encapsulated in a layer of encapsulant.

The manner in which the present invention provides its advantages can be more easily understood with reference to FIGS. 1 and 2, which illustrate a prior art light box arrangement for illuminating an LCD display 116. FIG. 1 is a top view of light source 110, and FIG. 2 is a cross-sectional view of light source 110 through line 2-2 shown in FIG. 1. Light source 110 utilizes an array of LEDs 111 to illuminate a light pipe 112. The LEDs are mounted on a circuit board 113 that is mounted on a second board 115 that provides power to the LEDs. The LEDs are positioned such that light leaving the top of each LED illuminates the end of light pipe 112. The light 123 entering light pipe 112, at an angle with respect to the surface 121 that is less than the critical angle, is reflected back and forth within light pipe 112 until the light is either absorbed or scattered by particles 122 on surface 117. The scattered light that strikes surface 121 at angles greater than the critical angle escapes from the light pipe and illuminates the back surface of LCD display 116. The bottom surface of the light pipe is covered with a reflective material; hence, any light striking the bottom surface is reflected upward.

In the region of the light pipe near the LEDs, some of the rays will enter the light pipe at angles greater than the critical angle and immediately escape through the top surface of the light pipe as shown at 124. It should be noted that rays striking the bottom surface at angles greater than the critical angle will be reflected upwards at angles greater than the critical angle with respect to surface 121 and will also be lost. As a result, region 125 of the light pipe is not used to illuminate the LCD display. This region acts as a mixing region for mixing the light from the various LEDs.

It should be noted that the amount of light that is lost through region 125 will, in general, depend on the vertical positioning of the LEDs. If the LEDs are too low, then more light will leave region 125, since a greater fraction of the light leaving the LEDs will strike surface 121 at angles greater than the critical angle. In addition, the size of region 125 is also dependent on the vertical positioning of the LEDs to some extent. While vertical-positioning errors can be accommodated by increasing the size of region 125, such increases increase the size of the display and the power needed to provide a given level of illumination to the LCD display.

The size of mixing region 125 also depends on the separation between the individual LEDs. The LEDs typically include LEDs that emit light in three wavelength bands, namely, red, blue, and green. The relative intensity of the light emitted in the wavelength bands determines the color of the light source as perceived by a human observer. Since each LED is typically limited to emitting light in only one band, the LEDs are normally arranged in an order in which each LED emits light in a different band from that of its neighbors. Mixing region 125 must be long enough to assure that light from a number of neighboring LEDs is mixed when the light leaves mixing region 125 to assure that there are no color variations in the regions beyond the mixing region. Accordingly, designs in which three LEDs that emit light in different bands are placed as close to one another as possible are preferred, since such an arrangement provides the better mixing of the colors in any given mixing region. In prior art systems of the type shown in FIGS. 1 and 2, the minimum spacing for the LEDs is limited by the packaging of the LEDs, and hence, larger mixing regions are needed.

Heat dissipation is also a significant problem for displays of the type discussed above. The heat generated by the LEDs is considerable, and hence, must be dissipated to the surrounding air by a surface that is greater than the area of substrate 113 on which the LEDs are mounted. Printed circuit board 115 can be utilized to dissipate the heat, provided there is sufficient contact area between substrate 113 and printed circuit board 115. To provide adequate heat conduction, substrate 113 is typically soldered to printed circuit board 115. The solder connections also provide the signal lines for the electrical signals used to drive the LEDs. This rigid coupling causes two problems. First, the accuracy of the alignment of the LEDs relative to light pipe 112 depends on the precision of this bond. Second, the heat transferred to printed circuit board 115 causes the printed circuit board to heat up during the operation of the LCD display. This change in temperature can result in the board flexing such that the alignment of the LEDs relative to the printed circuit board is altered.

The present invention utilizes a light source constructed on a flexible circuit carrier. Refer now to FIGS. 3-5, which illustrate a light source according to one embodiment of the present invention. FIG. 3 is a top view of light source 20, FIG. 4 is a cross-sectional view of light source 20 through line 4-4 shown in FIG. 3, and FIG. 5 is a cross-sectional view of light source 20 through line 5-5 shown in FIG. 3. Light source 20 includes a plurality of dies 21 arranged in a linear array. Each die includes an LED. In the case of a color light source the LEDs typically alternate in the color of light generated. The LEDs are mounted on a flexible circuit carrier 23 that includes a center region on which the dies are mounted and two side regions shown at 29 and 30 that are utilized in the mounting of the light source to a light pipe or other structure and in reflecting light from the LEDs. Circuit carrier 23 also includes tabs shown at 24 and 26 that are also used to secure the light source to a light pipe.

Circuit carrier 23 includes a number of electrical traces for connecting the LEDs to drive terminals that are accessed on a connector 25. In the embodiment shown in the Figures, each LED is connected to a common trace by an adhesive applied to the underside of the die and to a second drive trace by a wire bond 27. There may be a number of different drive traces, different LEDs being connected to different traces depending on the color of light generated by the particular LED. The details of some of the possible connection schemes will be discussed in more detail below.

The LEDs are encapsulated in a clear encapsulant 22. Encapsulant 22 can be a flexible encapsulant such as silicone or a rigid encapsulant. In the embodiment shown in FIGS. 3-5, the encapsulant is a continuous layer that covers all of the LEDs. However, as will be explained in more detail below, other encapsulant arrangements may be utilized.

In one embodiment, the side regions shown at 29 and 30 have reflective surfaces 43. The reflective surface can be provided by bonding a reflective material to the top surface of carrier 23 in the regions in question. In one embodiment of the present invention, the top surface of the carrier is formed from a layer of metal such as copper. In this case, a reflective metal such as nickel, silver, aluminum, tin, gold, solder, or an alloy thereof could be plated or sputtered onto the copper layer. Alternatively, a preformed layer of material having a reflective surface could be bonded to the top layer of carrier 23. In one embodiment of a light source according to the present invention, regions 29 and 30 are bent upward to form a reflector. In many LED designs, a significant fraction of the light generated in the LED is trapped and leaves the die through the sides of the die rather than through the top of the die. The reflector redirects this light to a direction that more nearly matches that of the light leaving the top of the die.

Refer now to FIGS. 6 and 7, which illustrate the manner in which a light source such as light source 20 described above can be bonded to a light pipe 41 to provide an extended light source 40 that is suitable for use in backlit displays. FIG. 6 is a top view of extended light source 40, and FIG. 7 is a cross-sectional view of extended light source 40 through line 7-7 shown in FIG. 6. Light pipe 41 is similar to the light pipes discussed above with respect to the light sources shown in FIGS. 1 and 2, and hence, will not be discussed in detail here. For the purposes of the present discussion, it is sufficient to note that light pipe 41 has an edge 47 into which light from the LEDs in light source 20 is injected.

Light source 20 is attached to light pipe 41 along edge 47 with the aid of the two side regions 29 and 30. The circuit carrier is bent along lines parallel to the line of LEDs such that regions 29 and 30 can be attached to the top and bottom surfaces of light pipe 41. A layer 42 of adhesive is used to bond regions 29 and 30 to the bottom and top surfaces, respectively, of light pipe 41 such that the layer 22 of encapsulant is butted against edge 47 with LEDs properly positioned to inject light into light pipe 41. An index of refraction matching gel can be placed between edge 47 and layer 22. As noted above, a flexible silicone encapsulant is used in one embodiment of the present invention. The encapsulant can thus deform to maximize the area of contact between layer 22 and edge 47.

Reflective layer 43 forms a cavity that redirects light that would not otherwise enter edge 47 into edge 47. The reflective surface can be highly polished or a matte finish. A matte finished surface provides additional mixing of the light from adjacent LEDs; however, some of the light that would otherwise enter the light pipe is lost.

As noted above, circuit carrier 23 also includes a connector 25 for providing connections to circuitry and power that is located off of circuit carrier 23. The bottom surface of the connector 25 can be patterned to include a number of terminals such as terminals 44 and 45 that can be soldered to an underlying circuit board or mated to corresponding contacts in a connector into which connector 25 is inserted on the external device.

Refer now to FIG. 8, which is a cross-sectional view of another embodiment of an extended light source according to the present invention. Extended light source 50 is similar to extended light source 40 discussed above, and hence, those elements of extended light source 50 that serve functions analogous to elements discussed above with respect to extended light source 40 have been given the same numeric designations. Extended light source 50 includes a rigid member 51 that runs along the length of the circuit carrier under the LEDs. Member 51 serves two functions. First, member 51 improves the reproducibility of the spacing of the LEDs with respect to edge 47 when the light source is applied to edge 47. This is particularly useful in embodiments utilizing a flexible encapsulant, in that any pressure applied to the light source during the attachment process is uniformly distributed along edge 47.

Second, member 51 acts as a heat sink to absorb heat from the LEDs and radiate that heat to the surrounding environment in those cases in which the exposed bottom metal layer of carrier 23 does not provide sufficient heat dissipation or thermal mass. In embodiments that make use of this aspect of member 51, member 51 is constructed from a material having good heat conduction properties, such as copper. The heat radiating capacity of member 51 can be increased by including fins 52 or other surface area increasing features on the outer surface of member 51. If the member does not also need to be rigid, the heat sink material could be formed from a flexible material such as a sheet of graphite or a metal foil.

In one embodiment of the present invention, the circuit carrier is constructed from a three-layer structure. Refer now to FIGS. 9 and 10, which illustrate a portion of a light source that has three dies of three different colors attached to a circuit carrier according to one embodiment of the present invention. FIG. 10 is a top view of light source 60 and FIG. 9 is a cross-sectional view through line 9-9 shown in FIG. 10. To simplify the figures, the layer of encapsulant has been omitted from the figures. In this example, the dies emit light in the red, blue, and green region of the spectrum. Die 281 is an example of a red emitting die. The dies are mounted on a carrier 272. Carrier 272 is constructed from an insulating substrate 274 that has two layers of metal deposited on opposite sides of substrate 274. Both of these layers are patterned to provide the various traces needed to power the dies and mount the dies. Die 281 is mounted on and connected electrically to pad 263, which is used to provide one of the power connections to die 281. The other power terminal of die 281 is on the top of die 281 and is connected to a trace 268 on layer 274 by a wire bond 257. Similarly, the green dies are connected to trace 267 on substrate 274, and the blue dies are connected to trace 269. In this embodiment, traces 267-269 are connected to traces 275-277, respectively, by conducting vias that pass through substrate 274. The conducting vias are shown at 264-266.

In this embodiment, dies that emit a particular light are driven in parallel and utilize a common ground plane that includes the mounting pads such as mounting pad 263. The traces 275-277 and a trace connecting the common mounting pads are available on the bottom side of circuit carrier 274 and can be connected to the terminals on the bottom surface of the substrate such as terminals 44 and 45 discussed above.

Embodiments in which the LEDs are connected in series can also be constructed. Such embodiments assure that the same current flows through each LED. Refer now to FIG. 11, which is a top view of another embodiment of a light source according to the present invention. Light source 90 includes three types of dies that emit light in the red, blue, and green regions of the spectrum. The red-emitting dies are connected to trace 92; the blue-emitting dies are connected to trace 93, and the green-emitting dies are connected to trace 91. Each die is connected across a gap in the corresponding trace by two wire bonds whose other ends are connected to terminals on the die. For example, wire bonds 95 and 96 connect blue-emitting die 97 to trace 93. In this embodiment, the bottom surface of the die is also attached to the bottom metal layer to provide efficient heat conduction. A non-conducting adhesive can be utilized for this bond if the die has a power contact on the bottom surface of the die. Once again, the layer of encapsulant has been omitted from the drawing to simplify the drawing.

The die mounting pads are created by removing a portion of the top metal layer and substrate 274, thus leaving the bottom layer of metal exposed. The portions of the layers in question can be removed using lithographic techniques that are applied to an entire sheet of carrier material so that the mounting pads for a large number of dies can be fabricated together to reduce the cost per die. The metal layers can be constructed from a high thermal conductivity material such as copper. Hence, pad 263 provides a low thermal resistance path to an underlying heat spreading layer such as rigid member 51 discussed above.

In one embodiment, carrier 272 is constructed from a flexible printed circuit carrier. Flexible circuit carriers are constructed using polyamide-based insulating layers that are available commercially from Dupont. The insulating layer is provided with a copper layer on the top and bottom surfaces thereof. The top and bottom surfaces can be lithographically patterned to provide the various traces in a manner analogous to that used with conventional printed circuit boards. The dielectric layer is preferably between 10 µm and 100 µm. The metal layers are preferably between 10 µm and 150 µm. As a result, circuit carrier 272 can have a thickness between 30 µm and 400 µm. Hence, a light source according to the present invention does not significantly increase the thickness of a handheld device beyond the thickness restrictions imposed by the thickness of the light pipe.

Other forms of dielectric can also be utilized to construct a flexible circuit carrier of this type. For example, dielectric layers formed from siloxane, polyester, cyanate ester, bismaleimide, and glass fibers can also be utilized. The metal layers can also be formed from nickel, gold, silver, palladium, rhodium, tin, or aluminum.

In the above-described embodiments, the circuit carrier was constructed from a flexible substrate. Utilizing such substrates significantly reduces the cost of the light source. However, embodiments can be utilized in which the substrate is only flexible along the boundaries of the side regions discussed above. In addition, the flexible substrate can be rendered rigid in particular regions by bonding the substrate to a rigid member in those regions in a manner analogous to the use of rigid member 51 discussed above. Such rigid areas are useful in creating reflectors having particular shapes.

Refer now to FIG. 12, which is a cross-sectional view of another embodiment of an extended light source according to the present invention. Extended light source 200 is constructed from a light pipe 210 and a light source formed on a flexible carrier 211 in a manner analogous to that discussed above. Three planar rigid sections 212-214 are bonded to the bottom surface of carrier 211. The top surface of carrier 211 in regions 215 are plated with a reflective material such as nickel to provide planar reflectors for directing light from the sides of LEDs 216 into light pipe 210 at angles at which more of this light will strike the surfaces of light pipe 210 at angles greater than the critical angle.

Since the circuit carrier is flexible, non-planar reflector shapes can also be constructed. Refer now to FIG. 13, which is a cross-sectional view of another embodiment of an extended light source according to the present invention. Extended light source 220 is constructed from a light pipe 210 and a light source formed on a flexible carrier 221 in a manner analogous to that discussed above. Three rigid sections 222-224 are bonded to the bottom surface of carrier 221. The two rigid sections shown at 222 and 223 are cylindrical in shape.

The above-described embodiments utilized a single layer of encapsulant that was formed over all of the dies in the light source. However, other arrangements could be utilized. The choice of any particular arrangement depends on the particular light source being constructed. Refer now to FIG. 14, which a cross-sectional view of a linear array of dies on a substrate 253 in which the individual dies 252 are individually encapsulated in a layer of encapsulant 251. The encapsulant material could be clear or could include phosphor particles for converting a portion of the light generated by the LED on the die to light of a different spectrum. Such phosphor conversion is common in "white" LEDs. One form of white LED is constructed from a blue-emitting LED and a layer of phosphor that converts a portion of the blue light to light in the yellow region of the optical spectrum. The combination of blue and yellow light is perceived by a human observer to be white light.

Figure 15:
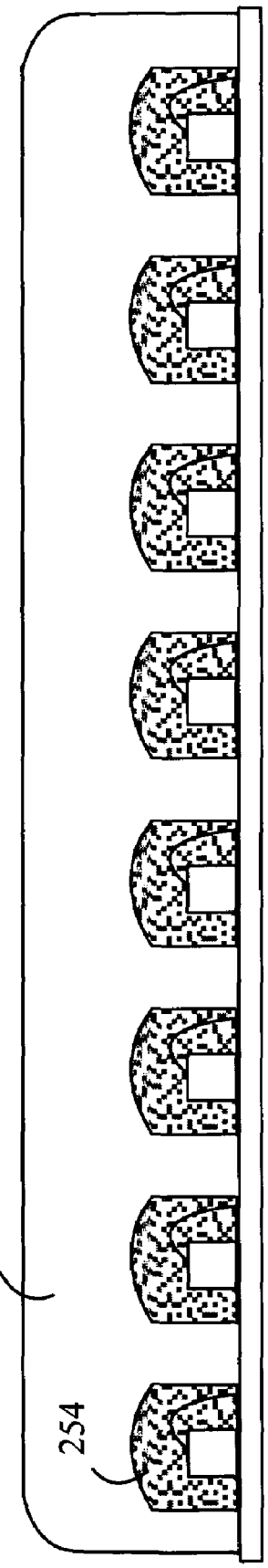
FIG. 15 is a cross-sectional view of a linear array of dies according to another embodiment of the present invention.

The individually encapsulated dies could also be covered by a layer of encapsulant that extends over all of the dies. Refer now to FIG. 15, which is a cross-sectional view of a linear array of dies according to another embodiment of the present invention. Each die is encapsulated in an individual layer of encapsulant 254 that includes phosphor particles to convert a portion of the light generated by the die. Different dies could be encapsulated in layers having different phosphors or all of the dies could utilize the same phosphor. The dies are then covered by a uniform layer of clear encapsulant 255 that facilitates the injection of light into a light pipe in a manner similar to that discussed above.

It should also be noted that the encapsulant layers can include other materials in addition to the fluorescent or luminescent materials used to convert light from the LEDs. For example, the encapsulant layers could include diffusants to spread the light and provide more uniform light mixing within the encapsulant layer. In addition, the encapsulant layers could include dyes or other agents that filter-out specific bands of light to shape the emission spectrum of the light source.

While flexible encapsulant materials such as silicone have a number of advantages, encapsulant layers formed from epoxy could also be utilized. The epoxy has the advantage of providing a rigid member in the region of the dies in addition to encapsulating the dies.

The embodiment shown in FIGS. 3-5 utilizes a connector 25 along one edge of the light source to provide electrical connections to the LEDs on the dies. However, embodiments in which the connector is formed on one or both of the tabs shown at 24 and 26 could also be constructed.

In the above-described embodiments of the present invention, the top surface of the substrate was described as being reflective in certain regions. For the purposes of this discussion a surface is defined to be reflective for the light emitted by the dies or the phosphors, in the case of an encapsulant layer containing phosphors or luminescent materials, if the surface reflects more than 80 percent of that light. The surface can have a mirror finish or a matte finish.

Various modifications to the present invention will become apparent to those skilled in the art from the foregoing description and accompanying drawings. Accordingly, the present invention is to be limited solely by the scope of the following claims.

What is claimed is:

1. An extended light sources, comprising:
a light source comprising a flexible substrate comprising a die mounting region and first and second attachment regions, a first flexible portion being disposed in said flexible substrate between said die mounting region and said first attachment region and a second flexible portion being disposed in said flexible substrate between said die mounting region and said second attachment region such that said flexible substrate is bendable in said first and second flexible portions;
a plurality of dies bonded to said substrate in said die mounting region, each die comprising a semiconductor light emitting device configured to emit light therefrom; and
a light pipe comprising a sheet of transparent material having top and bottom surfaces and a first edge surface, said light source being attached to said sheet such that a portion of said first attachment region is bonded to said top surface and a portion of said second attachment region is bonded to said bottom surface, said die attachment region being positioned opposite to said first edge such that at least portions of light emitted from said dies enters said sheet through said first edge, said first attachment region being disposed at a first angle in respect of said die mounting region as a result of said flexible substrate being bent in said first flexible portion, said second attachment region being disposed at a second angle in respect of said die mounting region as a result of said flexible substrate being bent in said second flexible portion, at least portions of said first and second attachment regions further being reflective and configured to reflect at least portions of light emitted from said dies and incident thereon towards said sheet and said first edge, said flexible substrate comprising a top surface and a bottom surface, said extended light source top surface being opposite to said edge, said extended light source further comprising a rigid member bonded to said bottom surface of said flexible substrate in said die mounting region, said flexible substrate comprising a connector region outside of said die mounting region and having a plurality of electrical contacts connected to electrical traces within said die mounting region, said connector region being configured to mate to a connector that is external to said light source, said electrical traces comprising traces connected to said die, first, second and third planar rigid sections being bonded to a bottom surface of said flexible carrier, said first, second and third planar rigid sections corresponding, respectively, to said first attachment region, said die mounting region, and said second attachment region.

2. The extended light source of claim 1, wherein said reflective portions of said first and second attachment regions comprise a reflective coating.

3. The extended light source of claim 1, wherein portions of top surfaces of said first and second attachment regions are plated with a reflective material thereby to form said reflective portions of said first and second attachment regions.

4. The extended light source of claim 1, further comprising an encapsulant disposed over said plurality of dies.

5. The extended light source of claim 1, further comprising an encapsulant disposed individually over each of said plurality of dies.

6. The extended light source of claim 1, further comprising a first encapsulant disposed over said plurality of dies, or individually over each of said plurality of dies, wherein said first encapsulant includes phosphor particles for converting a portion of light generated by the plurality of dies to light of a different spectrum.

7. The extended light source of claim 6, further comprising a second encapsulant disposed over said first encapsulant, said second encapsulant being configured to facilitate the injection of light emitted by said plurality of dies into said light pipe.

8. The extended light source of claim 1, further comprising a first encapsulant disposed over said plurality of dies or individually over each of said plurality of dies, wherein said first encapsulant includes a diffusant configured to spread light and provide light mixing within said first encapsulant.

9. The extended light source of claim 8, further comprising a second encapsulant disposed over said first encapsulant, said second encapsulant being configured to facilitate the injection of light emitted by said plurality of dies into said light pipe.

10. An extended light source, comprising:
a light source comprising a flexible substrate comprising a die mounting region and first and second attachment regions, a first flexible portion being disposed in said flexible substrate between said die mounting region and said first attachment region and a second flexible portion being disposed in said flexible substrate between said die mounting region and said second attachment region such that said flexible substrate is bendable in said first and second flexible portions;
a plurality of dies bonded to said substrate in said die mounting region, each die comprising a semiconductor light emitting device configured to emit light therefrom; and
a light pipe comprising a sheet of transparent material having top and bottom surfaces and a first edge surface, said light source being attached to said sheet such that a portion of said first attachment region is bonded to said top surface and a portion of said second attachment region is bonded to said bottom surface, said die attachment region being positioned opposite to said first edge such that at least portions of light emitted from said dies enters said sheet through said first edge, said first attachment region being disposed at a first angle in respect of said die mounting region as a result of said flexible substrate being bent in said first flexible portion, said second attachment region being disposed at a second angle in respect of said die mounting region as a result of said flexible substrate being bent in said second flexible portion, at least portions of said first and second attachment regions further being reflective and configured to reflect at least portions of light emitted from said dies and incident thereon towards said sheet and said first edge, said flexible substrate comprising a top surface and a bottom surface, said extended light source top surface being opposite to said edge, said extended light source further comprising a rigid member bonded to said bottom surface of said flexible substrate in said die mounting region, said flexible substrate comprising a connector region outside of said die mounting region and having a plurality of electrical contacts connected to electrical traces within said die mounting region, said connector region being configured to mate to a connector that is external to said light source, said electrical traces comprising traces connected to said die, first and third curved rigid sections being bonded to a bottom surface of said flexible substrate, and a second planar rigid section being bonded to said bottom surface of said flexible substrate, said first, second and third rigid sections corresponding, respectively, to said first attachment region, said die mounting region, and said second attachment region.

11. The extended light source of claim 10, wherein portions of top surfaces of said first and second attachment regions are plated with a reflective material thereby to form said reflective portions of said first and second attachment regions.

12. The extended light source of claim 10, further comprising an encapsulant disposed over said plurality of dies.

13. The extended light source of claim 10, further comprising an encapsulant disposed individually over each of said plurality of dies.

14. The extended light source of claim 10, further comprising a first encapsulant disposed over said plurality of dies, or individually over each of said plurality of dies, wherein said first encapsulant includes phosphor particles for converting a portion of tight generated by the plurality of dies to light of a different spectrum.

15. The extended light source of claim 14, further comprising a second encapsulant disposed over said first encapsulant, said second encapsulant being configured to facilitate the injection of light emitted by said plurality of dies into said light pipe.

16. The extended light source of claim 10, further comprising a first encapsulant disposed over said plurality of dies or individually over each of said plurality of dies, wherein said first encapsulant includes a diffusant configured to spread light and provide light mixing within said first encapsulant.

17. The extended light source of claim 16, further comprising a second encapsulant disposed over said first encapsulant, said second encapsulant being configured to facilitate the injection of light emitted by said plurality of dies into said light pipe.

* * * * *